(12) United States Patent
Chen

(10) Patent No.: US 7,333,724 B2
(45) Date of Patent: Feb. 19, 2008

(54) CAMERA AND PIEZO CERAMIC MOTOR THEREFOR

(76) Inventor: Jack Chen, 300 Windsor Dr., Oak Brook, IL (US) 60521

( * ) Notice: Subject to any disclaimer, the term of this patent is extended or adjusted under 35 U.S.C. 154(b) by 133 days.

(21) Appl. No.: 11/208,468

(22) Filed: Aug. 18, 2005

(65) Prior Publication Data

US 2007/0040474 A1    Feb. 22, 2007

(51) Int. Cl.
*G03B 13/36*    (2006.01)
*G02B 7/04*    (2006.01)

(52) U.S. Cl. .................. 396/133; 348/357; 359/824
(58) Field of Classification Search ............ 396/85–87, 396/133; 348/240.3, 335, 345, 357; 359/824; 310/323.01, 323.16, 323.17, 330–332
See application file for complete search history.

(56) References Cited

U.S. PATENT DOCUMENTS

| | | | | |
|---|---|---|---|---|
| 3,204,133 A | * | 8/1965 | Tschudin | ............ 310/22 |
| 4,291,958 A | | 9/1981 | Frank | |
| 4,342,936 A | * | 8/1982 | Marcus et al. | ............... 310/330 |
| 4,868,595 A | * | 9/1989 | Tanaka et al. | ............... 396/133 |
| 4,871,939 A | * | 10/1989 | Clouser | ...................... 310/332 |
| 5,068,567 A | * | 11/1991 | Jones | ......................... 310/332 |
| 5,365,296 A | * | 11/1994 | Murakami et al. | ............ 396/80 |
| 5,576,894 A | | 11/1996 | Kuwana | |
| 5,626,312 A | | 5/1997 | Head | |
| 5,973,856 A | | 10/1999 | Kanbara | |
| 6,067,421 A | | 5/2000 | Kitazawa | |
| 6,215,605 B1 | | 4/2001 | Kuwana | |
| 6,229,607 B1 | | 5/2001 | Shirai | |
| 6,392,827 B1 | | 5/2002 | Ueyama | |
| 6,548,926 B2 | * | 4/2003 | Dobson | ...................... 310/82 |
| 6,853,507 B2 | | 2/2005 | Ryu | |

* cited by examiner

*Primary Examiner*—W.B. Perkey
(74) *Attorney, Agent, or Firm*—Robert L. Marsh

(57) ABSTRACT

A camera has an axially moveable cylinder retaining a lens and a piezo ceramic motor for axially moving the cylinder. The motor has a piezo ceramic drive member that incrementally advances the cylinder in response to the application of an electric potential and a piezo ceramic brake that locks the cylinder against movement. The drive member and the brake are alternately energized to advance the cylinder in a series of incremental steps.

16 Claims, 5 Drawing Sheets

CAMERA AND PIEZO CERAMIC MOTOR THEREFOR

The present invention relates to cameras and to a miniaturized motor for focusing the camera, the motor employing the expansion and contraction qualities of piezo ceramic material.

BACKGROUND OF THE INVENTION

One consequence of technological advances in electronics, including electronic photography, has been a considerable reduction in size of photographic equipment. There are certain factors, however, that limit the further reduction in size of certain devices employing both mechanics and electronics such as digital cameras and the like. One of those limiting factors in the space requirements for the motors that are needed to control the focal length of lenses and the like for electronic cameras. To provide photos that are in focus regardless of the distance between the photographer and the subject, the camera must be capable of sensing the distance to the subject being photographed and be able to adjust the focal length of the lens prior to the picture being taken.

Modern sensing devices are electronic and employ a minimum of space, but there are physical limitations to reducing the size of the mechanics needed to adjust the focal length of a lens. Typically, such cameras have concentric inner and outer tubes, one of which is mounted to the body of the camera and the other of which has a lens across one end thereof. Threadings between the tubes allow adjustment of the focal length by the rotation of the tube with the lens causing axially movement thereof. Where the camera has electronic sensing, it is desirable that miniaturized motors rotate the tube with the lens mounted thereon.

There is a limit to the degree that an electric motor of the type having a rotor, a stator, windings, and brushes can be miniaturized. It would be desirable, therefore, to provide a motor that can be used with small mechanical devices such as electronic cameras, and can be miniaturized beyond the limits of existing electric motors.

SUMMARY OF THE INVENTION

Briefly, the present invention is embodied in a camera having an electric motor that employs the expansion and contraction qualities of piezo ceramic material to adjust the focal length of the lens. In simplified form, the motor has a drive means that employs a piezo ceramic material that expands or contracts in response to the application of electric potential across opposing surfaces thereof, with the expansion or contraction of the piezo ceramic material causing an incremental movement of a moveable member. The motor also has a brake means that also employs the expansion and contraction qualities of a piezo ceramic material to apply a brake for locking the moveable member against reverse movement while the piezo ceramic material of the driver means relaxes, contracting or expanding depending on the physical properties of the material, in response to the interruption of the electric potential.

An electric potential is intermittently applied to the drive means to cause a series of incremental urges for movement of the moveable member in a first direction. An electric potential is also intermittently applied to the piezo ceramic brake for intermittently locking the moveable member against movement. In accordance with the invention, the electric potential is alternately applied to the drive means and the brake means. As a result, the moveable member is advanced in the first direction in response to the application of power to the drive means, then locked in place by the brake means while the piezo ceramic material of the drive means reconfigures in response to the cessation of electric potential. Power to the brake means is then terminated when the electric potential is again applied to the drive means such that the moveable member advances in a series of increments in the first direction.

In the preferred embodiment, both the drive means and the brake means employ elongate semi-rigid members made out of a suitable material such as a metal, with a strip of piezo ceramic material applied along one side of the length thereof. Connectors are attached to the piezo ceramic material to cause alterations in the length of the piezo ceramic material in response to the application of the electric potential thereby causing the elongate member to bend along its length. One end of the elongate member is secured to a stationary member in cantilever relationship and the opposite end thereof is positioned to engage the moveable member. In the case of the drive means, the free end of the elongate member is adapted to incrementally urge the moveable member in the first direction as it is deflected in response to the application of an electric potential. Where the moveable member is a rotatable cylinder holding a camera lens, a first elongate member may be needed to rotate the cylinder clockwise and a second elongate member needed to rotate the cylinder counterclockwise. In the case of the brake means, the free end of the elongate member is adapted to contact the moveable member and lock it against further movement in response to the application of the electric potential.

In a second embodiment of the invention, a single elongate member is provided to rotate a moveable or rotatable member, such as rotatable lens member, in either the clockwise or counterclockwise direction. In this embodiment, a fork is provided at the free end of the elongate member with one end of the fork engaging the rotatable member to rotate it in the clockwise direction and the other end of the fork engaging the rotatable member to rotate it in the counterclockwise direction. Power is applied with the polarity in one direction to cause clockwise rotation and in the opposite polarity to cause counterclockwise rotation.

BRIEF DESCRIPTION OF THE DRAWINGS

A better understanding of the invention will be had after a reading of the following detailed description taken in conjunction with the drawings wherein.

DETAILED DESCRIPTION OF A PREFERRED EMBODIMENT

Figure 1:
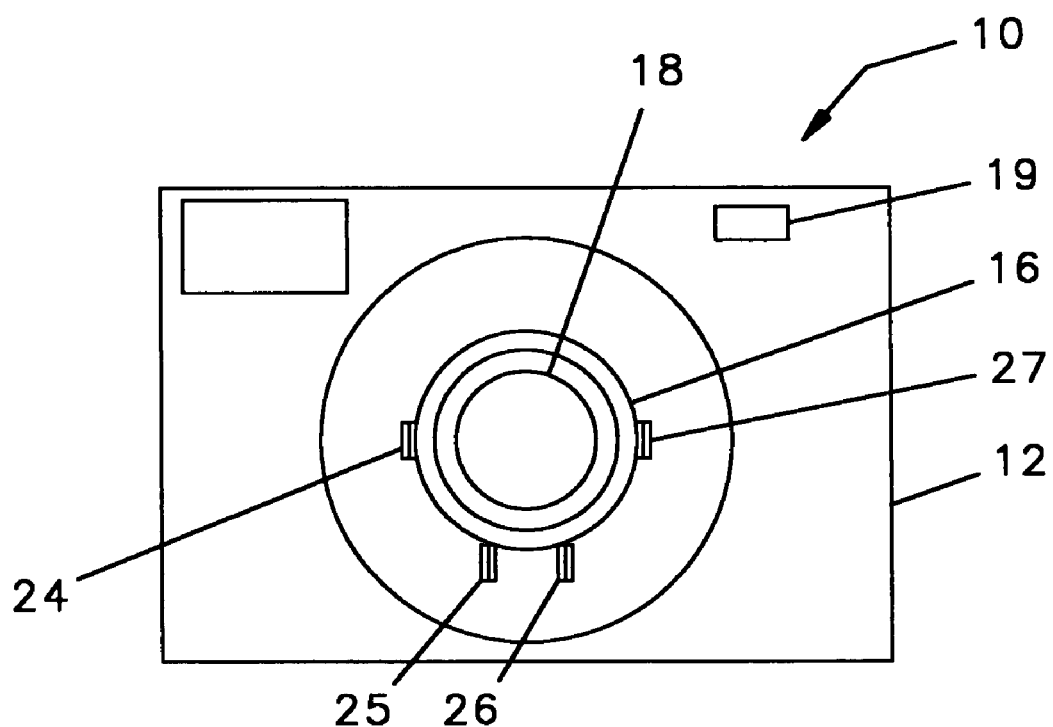
FIG. 1 is a front elevational view of a camera having a telescopic lens and fitted with a piezo ceramic motor, including a drive and a brake, in accordance with the present invention.
Figure 2:
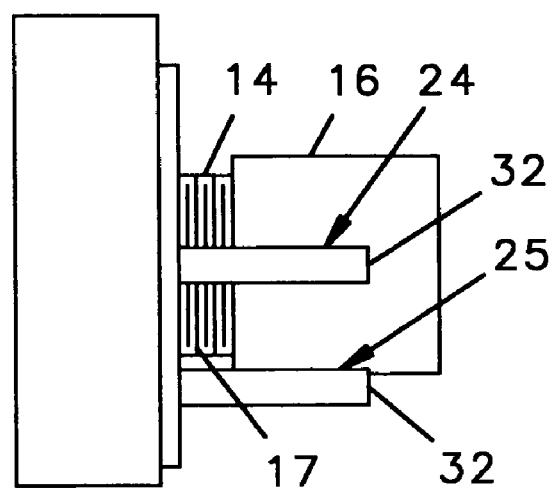
FIG. 2 is a side elevational view of the camera shown in FIG. 1.
Figure 4:
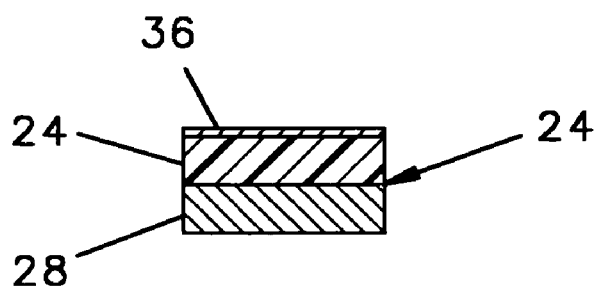
FIG. 4 is a cross-sectional view of the elongate member shown in FIG. 3 taken through line 4-4 thereof.
Figure 3:
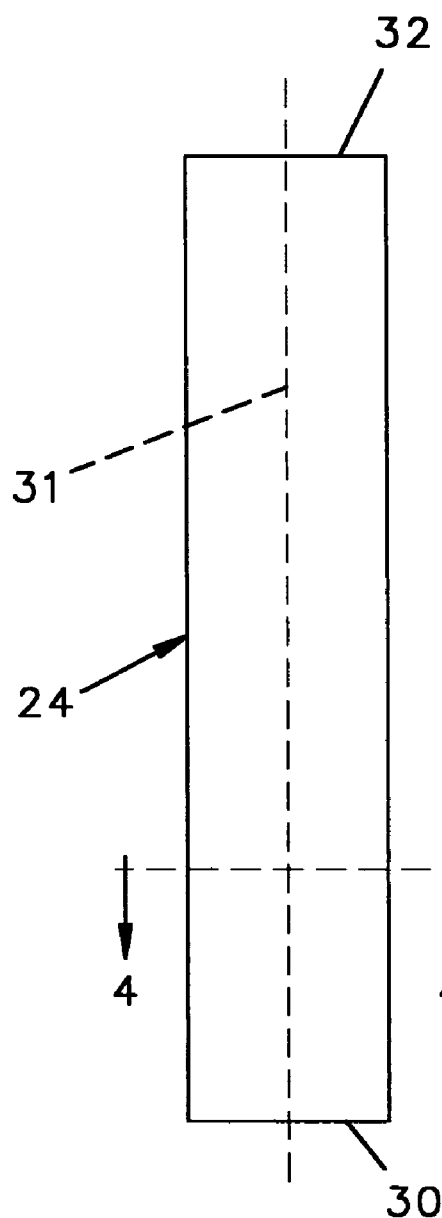
FIG. 3 is a side elevational view of an elongate member of the type employed in the drive and brake shown in FIG. 1.
Figure 5:
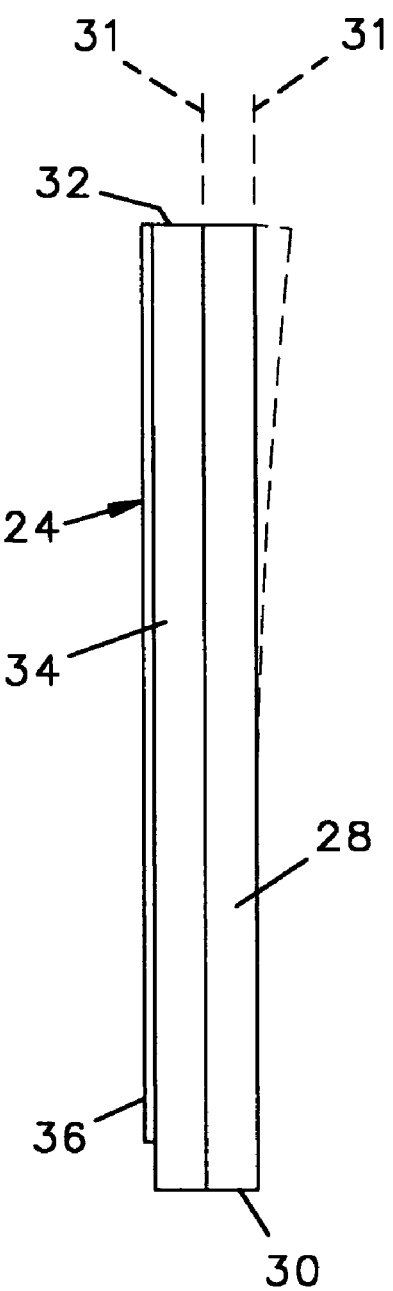
FIG. 5 is a side elevational view of the elongate member shown in FIG. 3 taken at ninety degrees thereto.

Referring to FIGS. 1 and 2, a camera 10 has a housing 12 that encloses the image preserving capabilities of the camera and any mechanical or electronic technology needed to focus the images seen through the lens thereof. Extending from the housing 12 is a stationary tube 14 and fitted around the circumference of the free end of the tube 14 is a rotatable tube 16. At the outer end of the rotatable tube 16 is a lens 18, and between the stationary tube 14 and the rotatable tube 16 are threadings 17 of the type known in the art. Rotation of the tube 16 will axially move the lens 18 and thereby change the focal length of for focusing the image seen through the lens 18 and projected upon the image preserving qualities of the camera 10.

Referring to FIGS. 1 through 5, the camera 10 further has a view finder 19 that enables the user to frame the image to be preserved and a plurality of sensors 20, 22 for sensing the amount of ambient lighting and the range to the subject to be photographed. The camera 10 further has a motor, consisting of a plurality of elongate members 24, 25, 26, 27 for rotating the tube 16 to change the focal length of the lens 18 as is further described below. The elongate members 24, 25, 26, 27 of which member 24 is representative of all four, have a first end 30 mounted on the housing 12 and a free end 32. When the elongate members are in their relaxed, or unenergized orientation, they have a linear axis 31 that extends from the housing 12 in parallel relationship and parallel to the axis of the concentric tubes 14, 16.

Referring to FIGS. 2 through 5, the elongate members 24, 25, 26, 27 have an elongate base 28 made of a suitable material such as steel or other generally rigid material, yet having a limited degree of elasticity such that the elongate base 28 will endure a degree of flex along its length without incurring failure in the form of a fracture or becoming permanently deformed. Extending along the length of the base 28 is a strip of piezo ceramic material 34 and extending along the surface of the strip of material 34 that is opposite the elongate base 28 is a coating of electrically conductive material 36. It should be appreciated that the coating of electrically conductive material 36 does not extend to the end 30 that is attached to the housing 12 such that the electrically conductive strip 36 is insulated from the grounded portions of the camera 10.

Figure 7:
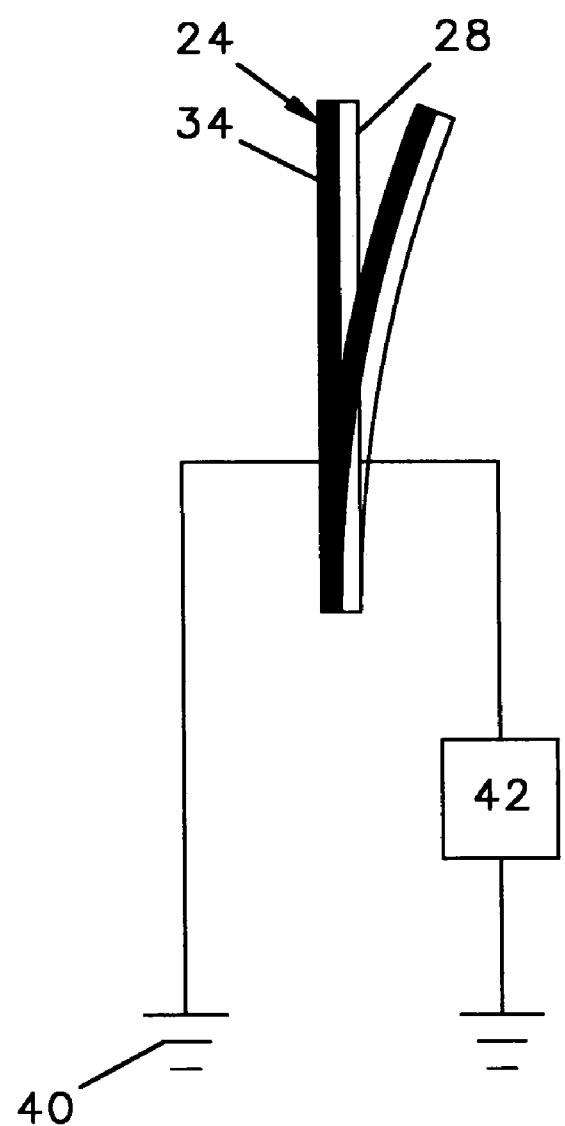
FIG. 7 is a block diagram of the circuit for operating the motor.

Referring FIG. 7, the present invention employs the expanding and contracting qualities of a piezo ceramic material and therefore also includes a power source 38, such as a battery having one pole of which connected to a ground 40. The other pole of the power source 38 is connected to an ICU 42, which, as is further described below, applies the other pole of the potential through a contact 44 to the coating of electrically conductive material 36 on the elongate member 24. Where the elongate base 28 is made of a metal or other electrically conductive material, the base 28 is connected to ground 40. Accordingly, when an electric potential from the battery 38 is applied across the coating 36 on one side and the elongate base 28 on the other, the strip of ceramic material 34 is caused to longitudinally expand causing the free end 32 of the elongate member 24 to deflect. The cessation of the application of electric potential across the coating 36 and base 28 will allow the piezo ceramic material to return to its original configuration, thereby allowing the elongate member 24 to return to its relaxed orientation.

Referring to FIGS. 1 and 2, when elongate member 25 undergoes deflection, the free end thereof will engage the surface of the tubes 16 at an angle of less than ninety degrees with the plane defined by the surface such that the tube 16 as viewed is urged to rotate counterclockwise. The outer surface of the tube 16 is sufficiently abraded to provide the friction needed to cause rotation of the tube 16 so that the deflecting end of member 25 will cause rotation of the tube 16 instead of merely slipping along the surface of the tube 16. Accordingly, when member 25 is electrically energized, the deflection of the free end will incrementally rotate the tube 16 counterclockwise.

On the opposite side of the lens 18 from elongate member 25 is elongate member 26 which is oriented so that when energized the free end will deflect and contact the tube 16 at an angle other than ninety degrees with the surface such that the tube 16 is urged incrementally to rotate in the clockwise direction.

The remaining pair of elongate members 24, 27 are oriented diametrically apart from one another and are positioned such that the free ends 32 thereof deflect radially with respect to the tube 16. The free ends 32 will therefore be compressed against the outer surface of the rotatable tube 16 so as to lock the tube 16 against rotation when members 24, 27 are energized.

Figure 6:
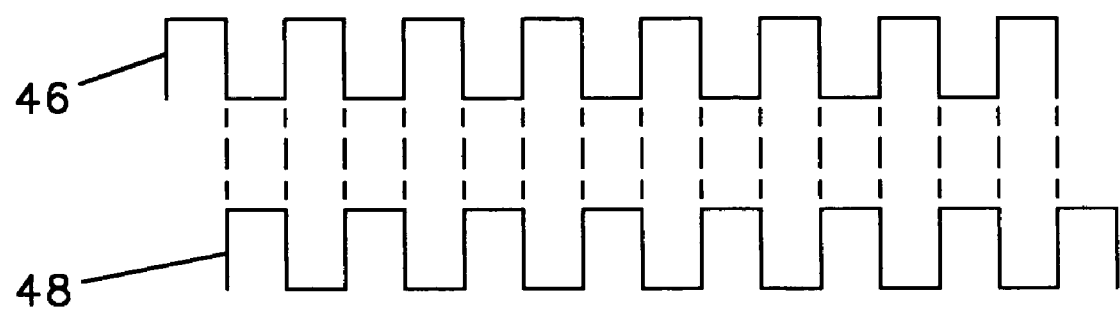
FIG. 6 is a graph of the voltage applied to the drive and brake members of the motor.

Referring to FIGS. 6 and 7, an ICU 42 is adapted to apply power in a square wave 46, or in a saw tooth, not shown, to the piezo ceramic material 34 of one of the two driving elongate members 25, 26. When one wave of power 46 is applied to member 25, the focusing tube 16 is incrementally rotated counterclockwise and when it is applied to member 26, the tube 16 is incrementally rotated clockwise. Power is also applied in a square wave 48 to the elongate braking members 24, 27, and square wave 48 has the same frequency and amplitude as wave 26. The wave 46 of power is applied to one of the driving members 25, 26 at a time that is one hundred and eighty degrees out of phase with the application of power in the square wave 48 to the elongate braking members 24, 27. Accordingly, when the free end 32 of one of the driving members 24, 27 is deflected and urges an incremental rotation of the rotatable tube 16, the free ends of the braking elongate members 24, 27 will remain unenergized. When power is terminated to the one of the driving members 25, 26 causing rotation, it is then applied to the braking members 24, 27. The free ends of the braking members 24, 27 will therefore engage the wall of the rotatable tube 16 and prevent the counter rotation thereof as the deflected drive member 25, 26 is allowed to relax and return to its unenergized orientation. As a result, the rotatable tube 16 is rotated clockwise or counterclockwise in a series of incremental steps with the tube 16 locked against rotation between each incremental movement while the operating drive member 25, 26 returns to its relaxed orientation.

It should be appreciated that without the locking of the focus tube 16 while the driving member 25 or 26 reconfigures back to its linear orientation, the tube 16 may be drawn in the reverse direction thereby canceling out, in whole or in part, the incremental rotation imparted when the drive member 24 or 26 is deflected.

The voltage of the power source 38 that is applied to the piezo ceramic material is chosen to maximize the expansion and contraction qualities of the material and the frequency of the waves 46 and 48 is chosen to maximize the efficiency of the motor. In the preferred embodiment, the voltage applied may be about 50 volts and the frequency of the waves 46, 48 may be about 3,000 pulses per second.

Figure 8:
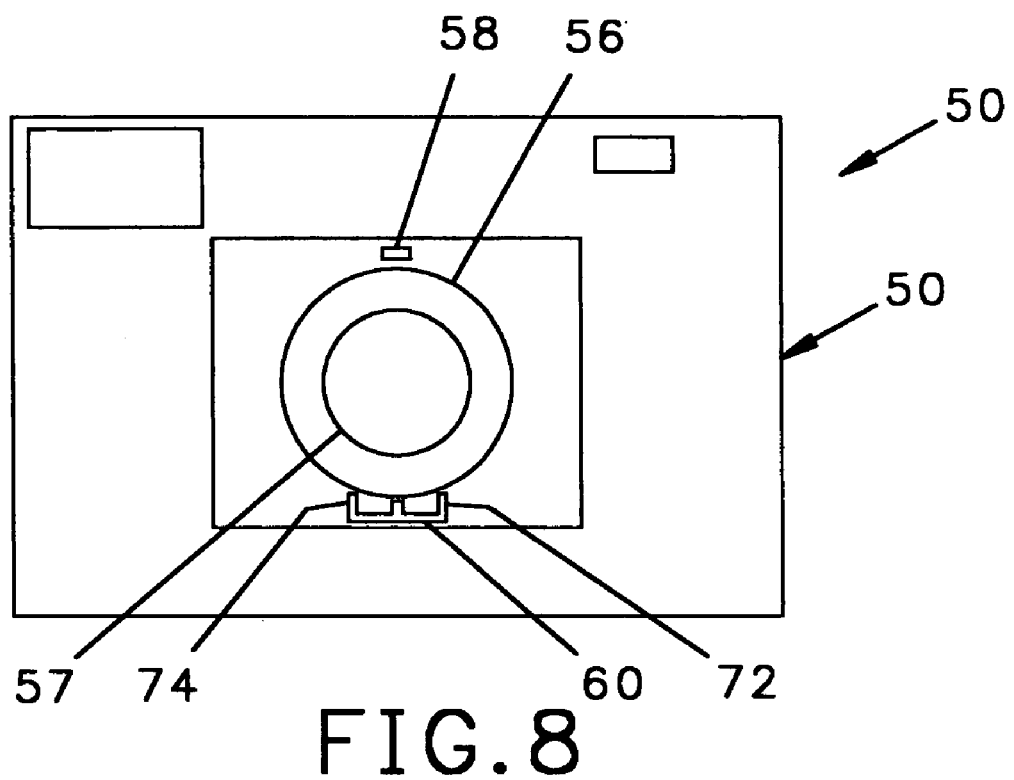
FIG. 8 is a front elevational view of a camera having a rotatable lens in accordance with another embodiment of the invention.
Figure 9:
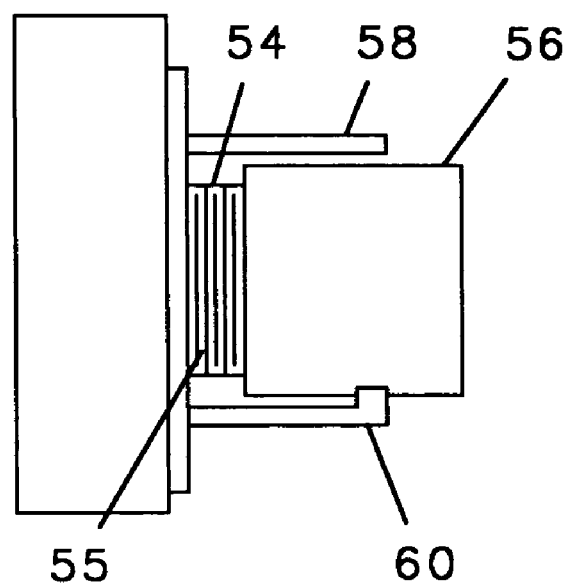
FIG. 9 is a side elevational view of the camera shown in FIG. 8.

The drive elements 25 and 26 may be combined into a single element for turning the lens either clockwise or counterclockwise. Referring to FIGS. 8 and 9, in this embodiment, the camera 50 has a housing 52, a stationary tube 54 having threadings 55 thereon, and a rotatable tube 56 with threadings on the inner surface thereon that are in engagement with the threads of the stationary tube 54 such that rotation of the rotatable tube 56 in one direction moves the lens 57 axially inward and rotation of the tube 56 in the opposite direction moves the lens 57 axially outward. The camera 50 further has at least one elongate braking member 58 similar to the breaking members 24, 27 of the first embodiment to engage the outer surface of the rotatable tube 56 and lock it against rotation between incremental rotational movements of the rotatable member. In this embodiment, a single driving member 60 causes rotation of the rotatable tube 56 in either the clockwise or the counterclockwise direction to thereby either lengthen or shorten the distance between the lens 62 and the film in the body 12 of the camera 50.

Figure 11:
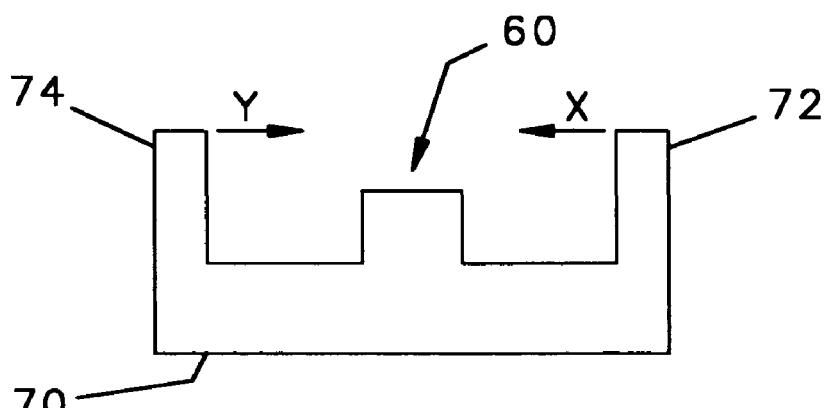
FIG. 11 is an end view of the drive member shown in FIG. 10.
Figure 10:
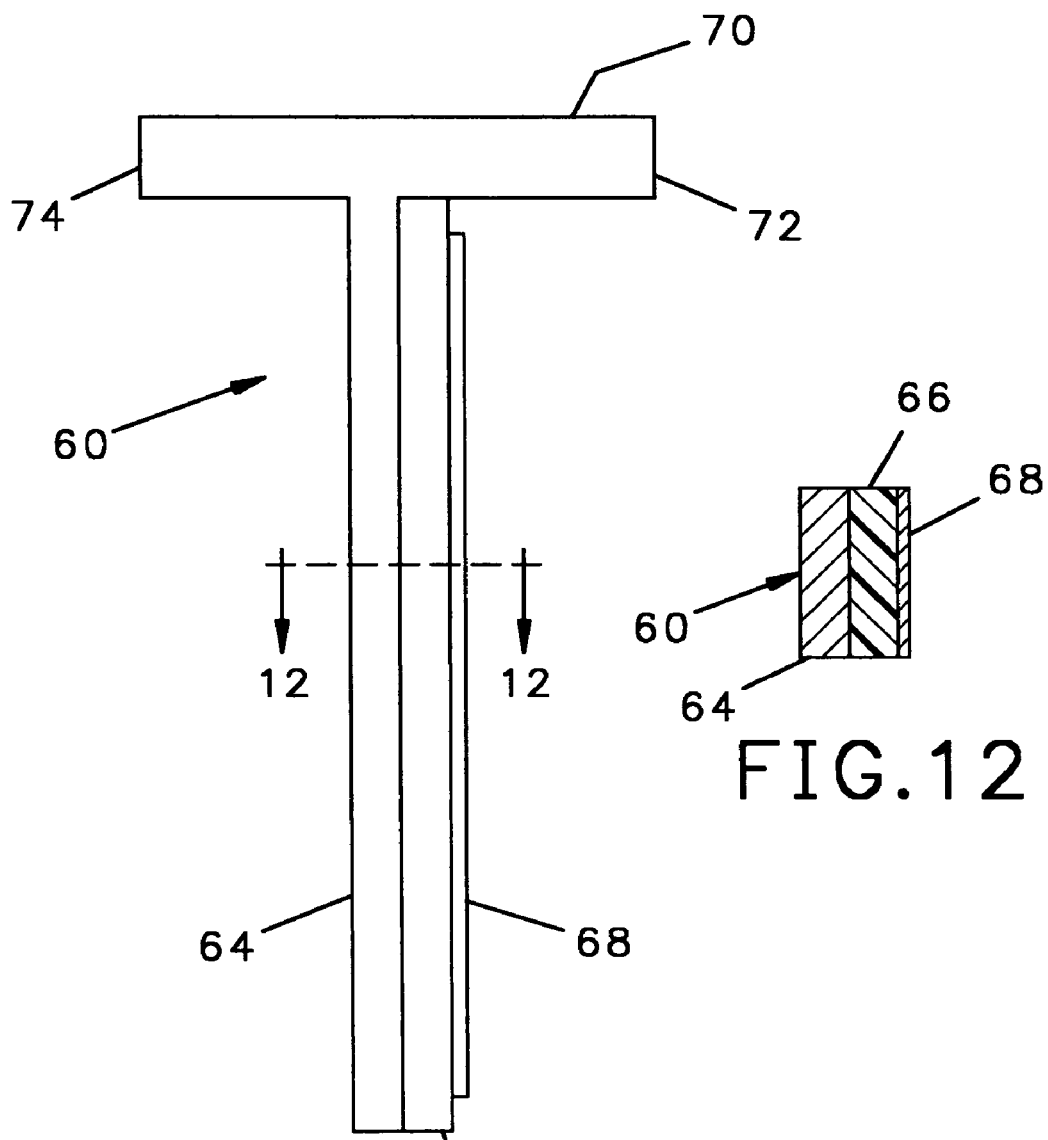
FIG. 10 is an enlarged bottom elevational view of the drive member on the camera shown in FIG. 8.
Figure 12:
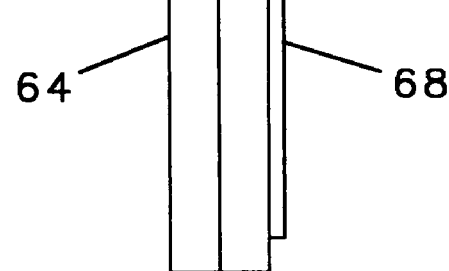
FIG. 12 is a cross-sectional view of the drive member shown in FIG. 9 taken through line 12-12 thereof.

Referring to FIGS. 10, 11, and 12, the drive member 60 consists of an elongate electrically conductive member 64 made of a semi-rigid material such as a steel. Bonded along one side of the elongate member 64 is a strip of piezo ceramic material 66 and extending along the surface of the strip of piezo ceramic material 66 that is opposite the conductive member 64 is a coating of conductive material 68.

One end of the drive member 60 is securely mounted to the housing 12 of the camera such that the length thereof extends parallel to the outer surface of the rotatable tube 56 in a cantilever configuration. At the free end of drive member 60 is a transverse fork 70 having first and second ends 72, 74 respectively with end 72 oriented to contact the outer surface of tube 56 when the member 60 is deflected in a first direction X to rotate the tube 56 in a clockwise direction, as viewed in FIG. 11, and the second end 74 oriented to contact the outer surface of the tube 56 when the member 60 is deflected in a second direction Y to rotate the tube 56 in the counterclockwise direction as view in FIG. 11.

In accordance with this embodiment, current is applied across the piezo ceramic material 66 with one polarity to cause expansion of the material and deflection of the member 60 in the X direction, and is applied across the piezo ceramic material 66 in the opposite polarity to cause contraction of the piezo ceramic material and deflection of the member 60 in the Y direction. Accordingly, when a series of electric pulses 46 as shown in FIG. 7 are applied in a first polarity, a series of surges are applied by end 72 against the surface of the tube 56 to rotate it clockwise, and when the polarity of the series of pulses is reversed, end 74 applies a series of surges against the surface of the tube 56 to rotate it counterclockwise. As with the first embodiment, a series of pulses 48 that are out of phase with pulses 46 are applied to the brake member 58 to lock the tube 56 against reverse rotation while the drive member 60 is returning to the relaxed orientation in which neither end 72, 74 engages the surface of the rotatable tube 56.

The heart of the camera of the present invention is a motor driven by piezo ceramic material to cause rotational or longitudinal movement of one member with respect to another, and it should be appreciated that the motor is useable in many other circumstances other than to adjust the lenses of a camera. The invention also has been described with respect to deflecting an elongate member, however, it should be appreciated that there are other methods by which the expansion and contracting qualities of a piezo ceramic material can be employed to apply the force required to operate a motor. There are therefore many modifications and variations which fall within the present invention and it is the intent of the appended claims to cover all such modifications and variations that fall within the spirit and scope of the invention.

What is claimed:

1. A camera comprising
   a housing containing photo preserving capabilities,
   a tubular member having a lens and an end,
   said tubular member being rotatably and axially moveable for changing a focal length of said lens,
   a piezo ceramic drive means on said housing for urging incremental rotational movement of said tubular member in a first direction in response to an electric potential,
   a piezo ceramic brake means on said housing for locking said tubular member against rotation in response to an electric potential,
   means for intermittently applying an electric potential to said drive means,
   means for intermittently applying an electric potential to said brake means wherein said electric potential is alternately applied to said drive means and said brake means for rotating said tubular member in said first direction in a series of incremental steps.

2. The camera of claim 1 wherein said piezo ceramic brake further comprises
   a generally rigid elongate member having a length, a longitudinal surface, a first end and a second end,
   a piezo ceramic material bonded to said longitudinal surface,
   said first end of said elongate member fixed to said housing
   means for applying said electric potential for changing a length of said piezo ceramic material wherein said second end is deflected by the application of said electric potential between a locking position and an unlocked position, wherein
   said second end contacts said tubular member for locking it against rotation.

3. The camera of claim 1 wherein said piezo ceramic drive further comprises
   a generally rigid elongate member having a length, a longitudinal surface, a first end and a second end,
   a piezo ceramic material bonded to said longitudinal surface,
   electrical contacts on opposite sides of said piezo ceramic material for applying said electric potential for changing a length of said piezo ceramic material wherein said second end is deflected by the application of said electric potential,
   said first end of said elongate member fixed in cantilevered fashion to said housing, and said second end incrementally rotating said tubular member in said first direction upon deflection of said elongate member.

4. The camera of claim 3 and further comprising a second piezo ceramic drive means for rotating said tubular member in a second direction.

5. The camera of claim 4 wherein said second piezo ceramic drive means further comprise
a second generally rigid elongate member having a length, a longitudinal surface, a first end and a second end,
a piezo ceramic material bonded to said longitudinal surface of said second elongate member,
electrical contacts for applying an electric potential to said piezo ceramic material on said second elongate member for changing a length of said piezo ceramic material wherein said second end of said second elongate member is deflected by the application of said electric potential,
said first end of said second elongate member fixed in cantilever fashion to said housing, and
said second end of said second elongate member having means for rotating said tubular member incrementally in a second direction upon deflection thereof.

6. The camera of claim 4 wherein said means for rotating comprises a yoke having a first end and a second end wherein said first end urges rotation of said rotatable member in said first direction and said second end urges rotation of said rotatable member in a second direction.

7. A motor comprising
a stationary member and a moveable member,
a piezo ceramic drive on said stationary member for urging incremental movement of said moveable member in a first direction in response to a pulse of electric potential,
said piezo ceramic drive comprising
a generally rigid elongate member having a length, a longitudinal surface, a first end, and a second end,
a piezo ceramic material bonded to said longitudinal surface,
means for intermittently applying an electric potential to said piezo ceramic drive for changing a length of said piezo ceramic material of said piezo ceramic drive in response to the application of said electric potential wherein said elongate member is deflected by the application of said electric potential,
said first end of said elongate member fixed in cantilever fashion to said stationary member, and
a yoke on said second end said yoke having a first end for urging said moveable member incrementally in a first direction upon deflection of said elongate member in a first direction and having a second end for urging said moveable member incrementally in a second direction upon deflection of said elongate member in a second direction.

8. A motor comprising
a stationary member and a moveable member,
a piezo ceramic drive having a first end and a second end,
said first end mounted on one of said stationary member and said moveable member,
said second end for engagement with the other of said stationary member and said moveable member, and
a yoke on said second end said yoke having a first end for urging said other of said stationary member and said moveable member in a first direction in response to a pulse of electric power having a first polarity and said yoke having a second end for urging said other of said stationary member and said moveable member in a second direction in response to a pulse of electric power having a second polarity.

9. The motor of claim 8 and further comprising
a piezo ceramic brake for locking and unlocking said moveable member against movement in response to an electric potential,
means for intermittently applying an electric potential to said drive,
means for intermittently applying an electric potential to said brake wherein said electric potential is intermittently applied to said drive and said brake for alternately moving and braking said moveable member for moving said moveable member in said first direction and in said second direction in a series of incremental steps.

10. A camera comprising
a housing containing photo preserving capabilities,
a tubular member having a lens and an end,
said tubular member being rotatably and axially moveable for changing a focal length of said lens,
a piezo ceramic drive on said housing, said drive incrementally rotating said tubular member in a first direction in response to an electric pulse, and
a piezo ceramic brake on said housing, said brake momentarily locking said tubular member against rotation in response to an electric pulse,
wherein electric pulses are alternately applied to said drive and said brake to cause rotation of said tubular member in said first direction in a series of incremental steps.

11. The camera of claim 10 wherein said piezo ceramic brake further comprises
a generally rigid elongate member having a length, a longitudinal surface, a first end and a second end,
said first end of said elongate member fixed to said housing,
a piezo ceramic material bonded to said longitudinal surface, and
electric contacts to opposite portions of said piezo ceramic material for applying said electric potential for changing a length of said piezo ceramic material wherein said second end is deflected by the application of said electric pulse between a locking position and an unlocked position, wherein said second end is in contact with said tubular member.

12. The camera of claim 10 wherein said piezo ceramic drive further comprises
a generally rigid elongate member having a length, a longitudinal surface, a first end and a second end,
said first end of said elongate member fixed in cantilevered fashion to said housing, and
a piezo ceramic material bonded to said longitudinal surface,
electrical contacts on opposite portions of said piezo ceramic material for applying an electric potential for changing a length of said piezo ceramic material wherein said second end is deflected by the application of said electric potential to incrementally rotate said tubular member in said first direction.

13. The camera of claim 12 and further comprising a second piezo ceramic drive for rotating said tubular member in a second direction.

14. The camera of claim 12 wherein electric potential is applied across said contacts in a first direction for deflecting said elongate member in a first direction and applied across said contacts in a second direction for deflecting said elongate member in a second direction wherein said tubular member is rotated in said first direction by said deflection in a first direction and is rotated in a second direction by said deflection in said second direction.

15. The camera of claim 13 wherein said second piezo ceramic drive further comprises a second generally rigid elongate member having a length, a longitudinal surface, a first end and a second end, a piezo ceramic material bonded to said longitudinal surface of said second elongate member, electrical contacts for applying an electric potential to said piezo ceramic material on said second elongate member for changing a length of said piezo ceramic material wherein said second end of said second elongate member is deflected by the application of said electric potential, said first end of said second elongate member fixed in cantilever fashion to said housing, and said second end of said second elongate member urging said tubular member incrementally in said second direction upon deflection for rotating said tubular member incrementally in a second direction.

16. The camera of claim 14 and further comprising a yoke having a first end and a second end wherein said first end urges rotation of said rotatable member in said first direction and said second end urges rotation of said rotatable member in a second direction.

* * * * *